(12) United States Patent
Hyun

(10) Patent No.: US 11,512,236 B2
(45) Date of Patent: Nov. 29, 2022

(54) SILICONE COMPOSITION FOR TEMPORARY BONDING ADHESIVE, ELECTRONIC ARTICLE COMPRISING CURED BODY OF THE SAME, AND MANUFACTURING METHOD THEREOF

(71) Applicant: DOW SILICONES CORPORATION, Midland, MI (US)

(72) Inventor: Dae-Sup Hyun, Midland, MI (US)

(*) Notice: Subject to any disclaimer, the term of this patent is extended or adjusted under 35 U.S.C. 154(b) by 323 days.

(21) Appl. No.: 16/635,548

(22) PCT Filed: Jul. 31, 2018

(86) PCT No.: PCT/US2018/044588
§ 371 (c)(1),
(2) Date: Jan. 30, 2020

(87) PCT Pub. No.: WO2019/028015
PCT Pub. Date: Feb. 7, 2019

(65) Prior Publication Data
US 2020/0255710 A1    Aug. 13, 2020

(30) Foreign Application Priority Data
Jul. 31, 2017    (KR) .......................... 10-2017-0097214

(51) Int. Cl.
C09J 183/04       (2006.01)
C09J 5/06         (2006.01)
H05K 9/00         (2006.01)
C08K 7/22         (2006.01)

(52) U.S. Cl.
CPC ............... C09J 183/04 (2013.01); C08K 7/22 (2013.01); C09J 5/06 (2013.01); H05K 9/0081 (2013.01); *C09J 2203/326* (2013.01); *C09J 2301/502* (2020.08); *C09J 2301/504* (2020.08); *Y10T 156/1153* (2015.01)

(58) Field of Classification Search
CPC ..... C09J 183/04; C08J 9/22; C08J 9/16; C08J 9/228; C08J 9/18; C08K 7/22
See application file for complete search history.

(56) References Cited

U.S. PATENT DOCUMENTS

| | | | |
|---|---|---|---|
| 5,246,973 A | 9/1993 | Nakamura et al. | |
| 5,258,212 A | 11/1993 | Tomaru et al. | |
| 6,288,170 B1 | 9/2001 | Waid | |
| 6,420,037 B1 | 7/2002 | Tsuji et al. | |
| 6,459,878 B1* | 10/2002 | Tomoyuki | G03G 15/206 29/895.32 |
| 8,025,908 B2* | 9/2011 | Anderson | A61K 8/9789 424/727 |
| 2002/0192463 A1 | 12/2002 | Kiuchi et al. | |
| 2005/0016675 A1* | 1/2005 | Bain | B60J 10/70 156/293 |
| 2008/0057216 A1* | 3/2008 | Shintani | C09J 7/38 428/480 |
| 2008/0160293 A1* | 7/2008 | Arimitsu | C09J 7/22 428/343 |
| 2009/0114342 A1 | 5/2009 | Aoki et al. | |
| 2009/0181250 A1* | 7/2009 | Zmarsly | C09J 155/02 428/343 |
| 2011/0136321 A1* | 6/2011 | Kuroda | H01L 25/0657 438/459 |
| 2013/0240141 A1* | 9/2013 | Soejima | H01L 24/19 156/306.3 |
| 2014/0044957 A1* | 2/2014 | Hirayama | H01L 24/97 156/247 |
| 2015/0107669 A1* | 4/2015 | Gotoh | C08J 9/32 521/154 |
| 2015/0284597 A1* | 10/2015 | Carty | C09J 7/38 206/229 |
| 2017/0040478 A1 | 2/2017 | Gotoh et al. | |

FOREIGN PATENT DOCUMENTS

| | | | |
|---|---|---|---|
| EP | 269454 A2 | * | 6/1988 |
| JP | 02-274783 | * | 11/1990 |
| JP | H048788 A | | 1/1992 |
| JP | 2004091703 A | | 3/2004 |
| JP | 2010021247 A | | 1/2010 |
| JP | 2012057132 A | | 3/2012 |
| JP | 2013155295 A | | 8/2013 |
| JP | 2013256566 A | | 12/2013 |
| JP | 2016108353 A | | 6/2016 |
| WO | 2007123379 A1 | | 11/2007 |

OTHER PUBLICATIONS

Machine translation of JP 02-274783 into English (no date).*
International Search Report for PCT/US2018/044588 dated Oct. 18, 2018, 4 pages.
Machine assisted English translation of JP2010021247 obtained from https://patents.google.com/patent on Aug. 11, 2022, 10 pages.
Machine assisted English translation of JP2013155295 obtained from https://patents.google.com/patent on Aug. 11, 2022, 10 pages.
Machine assisted English translation of JP2016108353 obtained from https://patents.google.com/patent on Aug. 11, 2022, 13 pages.

(Continued)

*Primary Examiner* — Marc S Zimmer

(74) *Attorney, Agent, or Firm* — Warner Norcross + Judd LLP

(57) ABSTRACT

The present disclosure relates to a silicone composition for use as a temporary bonding adhesive comprising: (A) a polydiorganosiloxane having at least two alkenyl groups in each molecule; (B) a polyorganosiloxane having at least one silicon-bonded hydrogen atom in each molecule; and (C) a thermally expandable powder having an expansion ratio of 10 or more.

12 Claims, No Drawings

(56) References Cited

OTHER PUBLICATIONS

Machine assisted English translation of JP2013256566 obtained from https://patents.google.com/patent on Aug. 11, 2022, 9 pages.
Machine assisted English translation of JP2012057132 obtained from https://patents.google.com/patent on Aug. 11, 2022, 9 pages.
Machine assisted English translation of JP2004091703 obtained from https://patents.google.com/patent on Aug. 11, 2022, 8 pages.

* cited by examiner

SILICONE COMPOSITION FOR TEMPORARY BONDING ADHESIVE, ELECTRONIC ARTICLE COMPRISING CURED BODY OF THE SAME, AND MANUFACTURING METHOD THEREOF

CROSS-REFERENCE TO RELATED APPLICATIONS

This application is the National Stage of International Appl. No. PCT/US2018/044588 filed on 31 Jul. 2018, which claims priority to and all advantages of Korean Patent Application No. 10-2017-0097214, filed on 31 Jul. 2017, the content of which is incorporated herein by reference.

TECHNICAL FIELD

The present disclosure relates to a silicone composition for a temporary bonding adhesive, an electronic article comprising a cured body of the same, and a manufacturing method thereof.

BACKGROUND ART

Silicone compositions are known for their excellent properties such as resistance to heat and to cold, electrical insulation properties, weatherproof properties, repellency of water, transparency, and the like. Due to these properties, the compositions find wide applications in various industries. Silicone compositions which are curable by hydrosilylation reaction are also used as an adhesive due to their adhesion property in fields of automobiles, electronic/electrical articles, household electrical appliances, medical field, etc. There are needs when an adhesive is involved in permanent adhesion. On the contrary, there are also needs for an application of a temporary bonding adhesive which involves in a certain period of an adhesion and separation from the adherent to be removed thereafter.

U.S. Pat. No. 5,246,973, International Patent Publication No. WO 2007/123379 A1, and U.S. Pat. No. 6,240,037 etc., disclose a silicone rubber composition. However, the silicone rubber compositions disclosed in these references are related to a general sealant used in automobile, etc., and a coating agent to a textile and an airbag of a vehicle. They do not disclose a use of the material for a temporary bonding adhesive.

PRIOR ART DOCUMENTS

Patent Documents

Patent Document 1: U.S. Pat. No. 5,246,973 (reg. date Sep. 21, 1993)
Patent Document 2: International Patent Publication No. WO 2007/123379 A1 (pub. date Nov. 1, 2007)
Patent Document 3: U.S. Pat. No. 6,240,037 (reg. date Jul. 16, 2002)

BRIEF SUMMARY OF INVENTION

Technical Problem

An object of the present disclosure is to provide a silicone composition for a temporary bonding adhesive. Another object of the present disclosure is to provide an intermediate of an electronic article comprising a cured body of the silicone composition. Another object of the present disclosure is to provide a manufacturing method of an electronic article using the silicone composition.

Solution to Problem

The silicone composition of the present disclosure for a temporary bonding adhesive comprises:
(A) a polydiorganosiloxane having at least two alkenyl groups in each molecule;
(B) a polyorganosiloxane having at least one silicon-bonded hydrogen atom in each molecule; and
(C) a thermally expandable powder having an expansion ratio of 10 or more.

The intermediate of an electronic article of the present disclosure comprises a cured body of the silicone composition on at least a part of the surface.

The manufacturing method of an electronic article of the present comprises:
(a) coating the silicone composition on at least a part of the surface of an intermediate of an electronic article;
(b) forming a cured body by curing the silicone composition coated on the intermediate;
(c) surface treating the intermediate on which the cured body is formed; and
(d) removing the cured body from the intermediate.

Effects of Invention

The silicone composition of the present disclosure may perform as an adhesive which temporarily bonds to an adherent by hydrosilylation reaction and is separable in a comparatively simple way and/or without any residue by heating. Due to this performance, the adhesive may protect or mask a desirable part from a thermal treatment, electromagnetic treatment, or anodizing treatment of an adherent such as an electronic article. Thus, the temporary bonding adhesive using the silicone composition of the present disclosure may be applied in an electromagnetic interference (EMI) shield and anodizing process, for example.

DETAILED DESCRIPTION OF THE INVENTION

First, the silicone composition of the present disclosure is discussed below:
(A) Polydiorganosiloxane having at least two alkenyl groups in each molecule Component (A) is a polydiorganosiloxane having at least two alkenyl groups in each molecule. A suitable alkenyl group of component (A) has from 2 to 10 carbon atoms and the preferred species thereof are, for example, vinyl, allyl, and 5-hexenyl, etc. Component (A) may have silicon-bonded organic groups other than an alkenyl group. Such silicon-bonded organic groups are typically selected from monovalent saturated hydrocarbon groups, which preferably have from 1 to 10 carbon atoms, and monovalent aromatic hydrocarbon groups, which preferably have from 6 to 12 carbon atoms, which are unsubstituted or substituted with the groups that do not interfere with curing of the composition of the present disclosure, such as halogen atoms. Preferred species of the silicon-bonded organic groups are, for example, alkyls such as methyl, ethyl, and propyl; halogenated alkyls such as 3,3,3-trifluoropropyl; and aryls such as phenyl, etc.

The molecular structure of component (A) is typically linear, however, there can be some branching due to the presence of trivalent siloxane units within the molecule. In order to achieve a useful level of physical properties in the elastomer prepared by curing the silicone composition of the present disclosure, the molecular weight of component (A) should be sufficient so that it achieves a viscosity of at least 0.1 Pa·s at 25° C. The upper limit for the molecular weight of component (A) is not specifically restricted and is typically limited only by the processability of the silicone composition of the present disclosure.

Preferred embodiments of component (A) are polydiorganosiloxanes having alkenyl groups at the two terminals and are represented by the following formula (1):

(1)

In formula (1), each R' is an alkenyl group, which preferably contains from 2 to 10 carbon atoms, such as vinyl, allyl, 5-hexenyl, etc. R" does not contain ethylenic unsaturation, and is identical or different and individually selected from a monovalent saturated hydrocarbon group, which preferably contains from 1 to 10 carbon atoms, and a monovalent aromatic hydrocarbon group, which preferably contains from 6 to 12 carbon atoms. R" may be unsubstituted or substituted with the group that does not interfere with curing of the composition of the present disclosure, such as halogen atoms.

R''' is R' or R". m represents a degree of polymerization equivalent to that component (A) has a viscosity of at least 0.1 Pa·s at 25° C., preferably from 0.1 to 300 Pa·s, and more preferably from 0.3 to 20 Pa·s. A person skilled in the art can appropriately control the value of "m" in order to obtain such viscosity.

Optionally, some part of said component (A) can be polydiorganosiloxanes having alkenyl groups at the side chain position and represented by the following formula (1'):

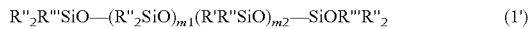
(1')

In formula (1'), R', R" and R''' are identical to those of formula (1), m1+m2 is an integer of one (1) or more, and m1+m2 represents a degree of polymerization equivalent to that component (A) has a viscosity of at least 0.1 Pa·s at 25° C., preferably from 0.1 to 300 Pa·s, and more preferably from 0.3 to 20 Pa·s. A person skilled in the art can appropriately control the value of "m1+m2" in order to obtain such viscosity.

Preferably, all of the R" and R''' of formula (1) are methyl. An alternative preference is that at least one of the R" and R''' or most of the R" and R''' of formula (1) is methyl and the remaining is phenyl or 3,3,3-trifluoropropyl. This preference is based on the availability of the reactants typically used to prepare the polydiorganosiloxanes (component (A)) and the desired properties for the cured elastomer prepared from compositions comprising such polydiorganosiloxanes.

Representative embodiments of component (A) containing ethylenically unsaturated hydrocarbon groups only at the terminals include, but are not limited to, dimethylvinylsiloxy-terminated polydimethylsiloxane, dimethylvinylsiloxy-terminated polymethyl-3,3,3-trifluoropropylslioxane, dimethylvinylsiloxy-terminated dimethylsiloxane-3,3,3-trifluoropropylmethylsiloxane copolymer, and dimethylvinylsiloxy-terminated dimethylsiloxane/methylphenylsiloxane copolymer.

Generally, component (A) has a viscosity of at least 0.1 Pa·s at 25° C., preferably from 0.1 to 300 Pa·s, and more preferably from 0.3 to 20 Pa·s.

(B) Polyorganosiloxane having at least one silicon-bonded hydrogen atom in each molecule Component (B) is an polyorganosiloxane, which operates as a cross-linker for curing component (A), by the addition reaction of the silicon-bonded hydrogen atoms in this component with the alkenyl groups in component (A) under catalytic activity of component (D) to be mentioned below. Component (B) normally contains 3 or more silicon-bonded hydrogen atoms so that the hydrogen atoms of this component can sufficiently react with the alkenyl groups of component (A) to form a network structure, in order to satisfactorily cure component (A). As this reaction causes the silicone composition to cure, it is easily understood that component (B) having two silicon-bonded hydrogen atoms still functions as a crosslinker, when component (A) has 3 or more alkenyl groups.

The molecular configuration of component (B) is not specifically restricted, and it can be a straight chain, branch-containing straight chain, or cyclic. While the molecular weight of this component is not specifically restricted, the viscosity is preferably from 0.001 to 50 Pa·s at 25° C. in order to obtain good miscibility with component (A).

Component (B) is preferably added in an amount so that the molar ratio of the total number of the silicon-bonded hydrogen atoms in this component to the total quantity of all alkenyl groups in component (A) is from 0.4:1 to 20:1, with 1:1 to 10:1 being preferred. When this ratio is less than 0.4:1, a well-cured composition is not obtained. When the ratio exceeds 20:1, there is a tendency for the hardness of the cured composition to increase when heated.

Examples of component (B) include but are not limited to:
(i) trimethylsiloxy-terminated methylhydrogenpolysiloxane;
(ii) trimethylsiloxy-terminated polydimethylsiloxane-methylhydrogensiloxane copolymer;
(iii) dimethylhydrogensiloxy-terminated dimethylsiloxane-methylhydrogensiloxane copolymer;
(iv) dimethylsiloxane-methylhydrogensiloxane cyclic copolymer;
(v) copolymer composed of $(CH_3)_2HSiO_{1/2}$ units and $SiO_{4/2}$ units; and
(vi) copolymer composed of $(CH_3)_3SiO_{1/2}$ units, $(CH_3)_2HSiO_{1/2}$ units, and $SiO_{4/2}$ units.

(C) Thermally expandable powder having an expansion ratio of 10 or more

Component (C) is a thermally expandable powder that comprises a volatile substance enclosed in shells composed of a thermoplastic resin and expands when heated. Examples of the thermoplastic resin that forms the shell of this component include polyethylene, polystyrene, polyvinyl acetate, polyvinyl chloride, polyvinylidene chloride, polyacrylonitrile, polymethyl methacrylate, polybutadiene, polychloroprene, and other vinyl polymers and copolymers thereof; Nylon 6, Nylon 66, and other polyamides; and polyethylene terephthalate, polyacetal, and blends thereof. Examples of the volatile substance enclosed in the thermally expandable powder include butane, isobutene, propane, and other hydrocarbons; methanol, ethanol, and other alcohols; dichloroethane, trichloroethane, trichloroethylene, and other halogenated hydrocarbons; and diethyl ether, isopropyl ether, and other ethers.

The shape of component (C) may be spherical, needle-shaped, amorphous, etc., but is not limited thereto.

The expansion ratio of component (C) is 10 or more, preferably 10 to 15. When the expansion ratio of component (C) is 10 or more, it is advantageous in being separated without residues when used as a temporary adhesive to be temporarily adhered to an adherent. It does not matter if the expansion ratio is 15 or more. However, in a practical aspect, a thermally expandable powder having an expansion ratio of 15 or more is not necessary. Said expansion ratio is a rate between the length before and after expansion, which means the rate of the average particle diameter after expansion to the average particle diameter before expansion.

It is preferable that the average particle diameter of component (C) is in the range of 1 to 60 μm with a more preferable range of 5 to 50 μm prior to expansion and 10 to 660 μm with a more preferable range of 50 to 550 μm after expansion. When the average particle diameter before and after expansion has a value of the lower limit or higher, an excessive increase of the viscosity of the adhesive may be minimized. When it has a value of the upper limit or lower, there is no problem in adhesive discharging. The average particle diameter can be measured and determined by thermomechanical analyzer even before heat-expansion thereof.

In measuring the expansion ratio and the average particle diameter of component (C), a thermomechanical analyzer is used. An expansion ratio varies according to temperature. Herein, an expansion ratio of component (C) is defined as an expansion ratio at the temperature when the expansion ratio is at a maximum.

The amount in which component (C) is compounded is usually 1 to 30 parts by weight per 100 parts by weight of the total composition of the present disclosure. The adhesive is not easily separable due to low effect of thermal expansion if the amount is less than 1 part by weight. If the amount is larger than 30 parts by weight, the viscosity of the silicone composition will be too high to process the silicone composition and/or the economic efficiency will be low due to an increase in manufacturing cost. It is preferable that the amount of component (C) is in the range of 1 to 30 parts by weight per 100 parts by weight of the total composition, with a more preferable range of 2 to 10 parts by weight.

(D) Hydrosilylation reaction catalyst

The silicone composition of the present disclosure may further comprise component (D), which is a hydrosilylation reaction catalyst. Curing of the silicone composition of the present disclosure is performed by component (D), which is a hydrosilylation catalyst that is a metal selected from the platinum group of the periodic table, or a compound of such metal. The metals include platinum, palladium, and rhodium. Platinum and platinum compounds are preferred due to the high activity level of these catalysts in hydrosilylation reaction.

Examples of preferred curing catalysts include but are not limited to platinum black, platinum on various solid supports, chloroplatinic acids, alcohol solutions of chloroplatinic acid, and complexes of chloroplatinic acid with liquid ethylenically unsaturated compounds such as olefins and organosiloxanes containing ethylenically unsaturated silicon-bonded hydrocarbon groups. Complexes of chloroplatinic acid with organosiloxanes containing ethylenically unsaturated hydrocarbon groups are described in U.S. Pat. No. 3,419,593, etc. One preferred example is a complex of platinum with alkenyl-modified polysiloxane, i.e., 1,3-divinyl-1,1,3,3-tetramethyldisiloxane.

The concentration of component (D) in the silicone composition of the present disclosure is equivalent to a platinum-group metal concentration from 0.1 to 500 parts by weight of platinum-group metal, per million parts (ppm), based on the combined weight of the components (A) and (B).

Mixtures of the aforementioned components (A), (B), and (D) may begin to cure at ambient temperature.

(E) Hydrosilylation reaction inhibitor

In order to obtain a longer working time or pot life of the silicone composition of the present disclosure, a suitable inhibitor of component (E) can be used for retarding or suppressing the activity of the catalyst. For example, the alkenyl-substituted siloxanes as described in U.S. Pat. No. 3,989,887 may be used.

Another class of known inhibitors of platinum catalysts includes the acetylenic compounds disclosed in U.S. Pat. No. 3,445,420. Acetylenic alcohols such as 2-methyl-3-butyn-2-ol constitute a preferred class of inhibitors that will suppress the activity of a platinum-containing catalyst at 25° C. Compositions containing these inhibitors typically are heated at temperature of 70° C. or above to cure at a practical rate.

Inhibitor concentrations as low as 1 mole of inhibitor per mole of the metal can impart satisfactory storage stability and cure rate. In other instances, inhibitor concentrations of up to 500 moles of inhibitor per mole of the metal are required. The optimum concentration for a given inhibitor in a given composition is readily determined by routine experimentation.

Other Components

In order to achieve a high level of physical properties that characterize some types of cured elastomer that can be prepared using the silicone composition of the present disclosure, it may be desirable to optionally include a reinforcing filler such as finely divided silica. Silica and other reinforcing fillers are often treated with one or more known filler treating agents to prevent a phenomenon referred to as "creeping" or "crepe hardening" during processing of the curable composition.

Finely divided forms of silica are preferred reinforcing fillers. Finely divided silicas are particularly preferred due to their relatively high surface area, which is typically at least 50 square meters per gram. Fillers having surface areas of at least 200 square meters per gram are preferred for use in the present disclosure. Finely divided silicas can be of precipitated type (wet) or a fume type (dry). Both types of silica are commercially available.

The amount of finely divided silica or other reinforcing filler used in the silicone composition of the present disclosure is at least in part determined by the physical properties desired in the cured elastomer. The silicone composition of the present disclosure typically comprises from 0 to 50 parts by weight of a reinforcing filler (e.g., silica), per 100 parts by weight of the polydiorganosiloxane (component (A)). It is preferable that the amount of silica or other fillers does not exceed the amount that increases the viscosity of the silicone composition of the present disclosure above 300 Pa·s.

The filler treating agent can be any of low molecular weight organosilicon compounds disclosed in the art applicable to prevent creeping of polydiorganosiloxane compositions during processing.

The treating agents exemplify but are not limited to liquid hydroxyl-terminated polydiorganosiloxane containing an average from 2 to 20 repeating units of diorganosiloxane in each molecule, hexaorganodisiloxane, hexaorganodisilazane, and the like. The hexaorganodisilazane intends to hydrolyze under conditions used to treat the filler to form the organosilicon compounds with hydroxyl groups. Preferably, at least a portion of the silicon-bonded hydrocarbon radicals present in the treating agent is identical to a majority of the hydrocarbon radicals present in components (A) and (B). A small amount of water can be added together with the silica treating agent(s) as a processing aid.

It is believed that the treating agents function by reacting with silicon-bonded hydroxyl groups present on the surface of the silica or other filler particles to reduce interaction between these particles.

The filler may be surface-treated with the treating agent prior to formulating, and the treated filler is commercially available.

When untreated silica is used as a filler, it is preferably treated with a treating agent in the presence of at least a portion of the other components of the silicone composition of the present disclosure by blending these components together until the filler is completely treated and uniformly dispersed to a homogeneous material. Preferably, the untreated silica is treated with a treating agent in the presence of component (A).

Furthermore the silicone composition of the present disclosure may contain various optional components that are conventionally utilized in such compositions, such as pigments and/or dyes. Any pigments and dyes, which are applicable to silicone elastomers or coating but do not inhibit the hydrosilylation curing reaction type addition reaction, can be employed in the present disclosure. The pigments and dyes include but are not limited to carbon black, titanium dioxide, chromium oxide, bismuth vanadium oxide and the like. In a preferred embodiment of the present disclosure, the pigments and dyes are used in the form of a pigment master batch composed of the pigments and dyes dispersed in the polydiorganosiloxane with a low viscosity (component (A)) at a ratio of 25:75 to 70:30.

The other optional components include, for example, non-reinforcing fillers, such as diatomaceous earth, quarts powder, alumina and calcium carbonate; flame-retardants; and heat and/or ultraviolet light stabilizers.

The phase of the silicone composition of the present disclosure may be liquid phase or paste, but is not limited thereto. The silicone composition of the present disclosure may be used as a temporary bonding adhesive of an adherent such as an electronic article. The temporary bonding adhesive comprising the silicone composition of the present disclosure is adhered to an adherent as the silicone composition is cured by heat curing, and may be automatically separated from the adherent as the thermally expandable powder in the composition expands when heat of a temperature higher than the curing temperature is applied. Such temporary adhesive may be used for protecting or masking the coated part of the adherent from a surface treatment when the adherent is surface treated. The surface treatment includes thermal treatment, electromagnetic treatment, anodizing treatment, etc., but is not limited thereto. Specifically, it may be applied to electromagnetic interference (EMI) shield, anodizing process, etc., for example.

The present disclosure also provides an intermediate of an electronic article comprising a cured body of the silicone composition on at least a part of the surface. Herein, an "intermediate" means a previous state prior to the final product of practical use. For example, an intermediate may be a part comprised in the final particle. In addition, no matter whether it is a final product or a part thereof, an article to which a cured body by coating and curing the silicone composition of the present disclosure is adhered, it is an embodiment of an intermediate since the cured body will be finally removed.

The component of the cured body, i.e. formed by curing the silicone composition of the present disclosure, is a polydiorganosiloxane composite.

Herein, the electronic article includes those comprised in various kinds of displays such as smartphones, notebooks, touch pads, mobile phones, DMB terminals, PDAs, etc.; various kinds of household electrical appliances including washing machines, TVs, refrigerators, etc.; semiconductor products such as semiconductor wafers; and automobiles, but is not limited thereto. The coating of the silicone composition of the present disclosure may be for protecting or masking the coated part of the electronic article from surface treatment.

When the silicone composition of the present disclosure is used for a temporary bonding adhesive, it may be applied to an electromagnetic interference (EMI) shield and anodizing process for an electronic article, for example, but is not limited thereto. Hereinafter, application to electromagnetic interference shield and anodizing process will be described for easily interpreting the disclosure.

A masking process of the electromagnetic interference shield application is as follows.

This masking process may comprise the following steps (1) to (4):
  Step (1): Dispensing the aforementioned temporary bonding adhesive composition (=temporary bonding material, TBM) on a substrate of an electronic device,
  Step (2): Attaching a lid on the adhesive composition, and bonding the lid by curing the composition,
  Step (3): Coating an EMI shielding material on the lid, and
  Step (4): After further treatment of the intermediate of the electronic device, releasing the bonded lid from the substrate by further heating of the cured adhesive composition.

Conventionally, a method of bonding a pressure sensitive adhesive to the part to be protected or masked and releasing the adhesive by applying a mechanical force after a certain process was used. The application of the present disclosure to electromagnetic interference shield is advantageous not only in an economic aspect by using a low cost silicone material, but also in an aspect of process by automatically removing the adhesive by only increasing the temperature for thermal expansion, compared to conventional methods.

Moreover, the process is performed in a high temperature condition, i.e. metal is vaporized by sputtering and deposited on a silicone surface. Thus, the temporary adhesive used for electromagnetic interference shield requires resistance to heat. The temporary adhesive comprising the silicone composition of the present disclosure has such resistance to heat. On the contrary, conventional adhesives consisting of an organic material such as acryl, epoxy resin, etc., is relatively weak to heat. Hence, they are inappropriate for use as a temporary adhesive in such process.

The application of the present disclosure to an anodizing process is as follows.

This anodizing process may comprise the following steps (1) to (3):
  Step (1): Dispensing the aforementioned temporary bonding adhesive composition (=temporary bonding material, TBM) on an aluminum substrate of an electronic device, and curing the composition,
  Step (2): Anodizing treatment of the aluminum substrate partially covered by a cured body of the TBM, and
  Step (3): After said anodizing treatment of the aluminum substrate, releasing the cured body of TBM from the substrate by heating of the cured adhesive composition.

Conventionally, a method of bonding a pressure sensitive adhesive to the part to be protected or masked and releasing the adhesive by applying a mechanical force after a certain process, or a method of masking by coating a photosensitive or nonphotosensitive resist followed by releasing it using an etching solution or organic solvent, was used. Through said steps (1) to (3), an anodized aluminum substrate where intended parts are protected from anodizing by a TBM is easily obtained. As shown above, the cured body of a TBM can be easily released from the substrate by further heating, without any residue.

The present disclosure also provides a manufacturing method of an electronic article. The method comprises the following:
(a) coating the silicone composition of the present disclosure (i.e., temporary bonding material, TBM) on at least a part of the surface of an intermediate of an electronic article;
(b) forming a cured body by curing the silicone composition coated on the intermediate;
(c) surface treating the intermediate on which the cured body is formed; and
(d) removing the cured body from the intermediate.

In (a), the silicone composition may be coated in a form of liquid silicone composition, silicone gel composition, or semi-liquid flowable silicone elastomeric material. The uncured silicone composition is flowable and can be easily applied on a surface of a targeted article and the coating thickness can be designed depending on the coating intention (e.g., shielding process or treatment species).

It is preferable that the curing temperature of the silicone composition of (b) is in the range of 25° C. to 200° C. It is possible for the silicone composition to be easily changed from a liquid state to a solid state when the temperature is identical to or higher than the lower limit. It is possible for the cured body to maintain its shape after it is coated by inhibiting aseparation due to thermal expansion of the thermally expandable powder when the temperature is identical to or lower than the upper limit.

In (c), the cured body, which is a body cured of the silicone composition of the present disclosure, protects or masks the intermediate from surface treatment. The surface treatment includes thermal treatment, electromagnetic treatment, anodizing treatment, etc., but is not limited thereto.

In (d), the temporarily bonded cured body is removed from the electronic article due to expansion of the thermally expandable powder. It is preferable to conduct (d) at a temperature of between 100° C. to 285° C., but higher than the curing temperature of (b). It is possible for the thermally expandable powder to be suitably expanded when the temperature is identical to or higher than the lower limit. It is possible for the silicone cured body to be automatically removed easily without any artificial physical force when the temperature is identical to or lower than the upper limit. Further, the range of the curing temperature of (b) and the removing temperature of (d) are broad according to the type of the thermally expandable powder. The removing temperature of (d) is higher than the curing temperature of (b).

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The following examples are intended to illustrate the invention and are not to be viewed in any way as limiting to the scope of the invention.

EXAMPLES

The silicone composition, the intermediate of an electronic article comprising the cured body thereof, and the manufacturing method of an electronic article of the present disclosure will be further described in more detail, with reference to examples and comparative examples.

The contents not described herein are sufficiently derivable by a skilled person in this technical field. Thus, the explanation thereof is omitted.

Example 1

A curable silicone composition was prepared by uniformly mixing the following:

relative to 100 parts by weight of the curable silicone composition, 86.43 parts by weight of a polyorganosiloxane having both molecular terminals capped with dimethylvinylsiloxy groups and having the average unit formula:

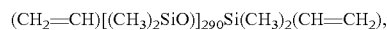

$(CH_2=CH)[(CH_3)_2SiO]_{290}Si(CH_3)_2(CH=CH_2)$, 1.61 parts by weight of a polyorganosiloxane having the average unit formula:

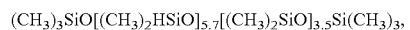

$(CH_3)_3SiO[(CH_3)_2HSiO]_{5.7}[(CH_3)_2SiO]_{3.5}Si(CH_3)_3$, 6.85 parts by weight of a hydrophobic fumed silica having a surface area of 120 m²/g, a complex of platinum with 1,3-divinyl-1,1,3,3-tetramethyldisiloxane in such an amount in which 4 ppm in weight units of metallic platinum is comprised, 0.025 parts by weight of 2-phenyl-3-butyn-2-ol as a reaction inhibitor, and 5.0 parts by weight of a thermally expandable powder of FN-78D (powder A, expansion ratio: 12) (Matsumoto Yushi Seiyaku Co., Ltd., Japan).

Example 2

A curable silicone composition was prepared in the same manner as in Example 1, except that a thermally expandable powder of MSH-380 (powder B, expansion ratio: 11) (Matsumoto Yushi Seiyaku Co., Ltd., Japan) was used instead of FN-78D.

Example 3

A curable silicone composition was prepared in the same manner as in Example 1, except that a thermally expandable powder of F-190D (powder C, expansion ratio: 10) (Matsumoto Yushi Seiyaku Co., Ltd., Japan) was used instead of FN-78D.

Comparative Example 1

A curable silicone composition was prepared in the same manner as in Example 1, except that a thermally expandable powder of F-65D (powder D, expansion ratio: 5) (Matsumoto Yushi Seiyaku Co., Ltd., Japan) was used instead of FN-78D.

Comparative Example 2

A curable silicone composition was prepared in the same manner as in Example 1, except that a thermally expandable powder of F-100MD (powder E, expansion ratio: 7.5) (Matsumoto Yushi Seiyaku Co., Ltd., Japan) was used instead of FN-78D.

Forming a Cured Body on an Electronic Article

A cured body was formed on an electronic article by using the silicone compositions above.

Performance of the Silicone Composition as a Temporary Bonding Adhesive

After coating the silicone composition of the present disclosure on an electronic article, a cured body was formed by a first cure at a temperature of 100° C., and the cured body was removed from the electronic article by a second cure at a temperature of 200° C.

During the first cure, if the cured body coated with the silicone composition was adhered to the electronic article, it is shown as "X," and if not, "0."

During the second cure, if the cured body was automatically removed from the electronic article, it is shown as "0," and if not, "X." Three times of experiments were conducted for each of the Examples and Comparative Examples.

In addition, when the cured body was removed, if there were many residues, the performance is evaluated as "Bad." If not so, the performance is evaluated as "Good".

TABLE 1

| | Example 1 | Example 2 | Example 3 | Comparative Example 1 | Comparative Example 2 |
|---|---|---|---|---|---|
| Vinyl functional PDMS | 86.43 | 86.43 | 86.43 | 86.43 | 86.43 |
| Fumed silica | 6.85 | 6.85 | 6.85 | 6.85 | 6.85 |
| Hydrogen functional PDMS | 1.61 | 1.61 | 1.61 | 1.61 | 1.61 |

TABLE 1-continued

| | Example 1 | Example 2 | Example 3 | Comparative Example 1 | Comparative Example 2 |
|---|---|---|---|---|---|
| Inhibitor | 0.025 | 0.025 | 0.025 | 0.025 | 0.025 |
| Pt catalyst (in master batch) | 0.08 | 0.08 | 0.08 | 0.08 | 0.08 |
| Expandable powder A (expansion ratio: 12) | 5.0 | | | | |
| Expandable powder B (expansion ratio: 11) | | 5.0 | | | |
| Expandable powder C (expansion ratio: 10) | | | 5.0 | | |
| Expandable powder D (expansion ratio: 5) | | | | 5.0 | |
| Expandable powder E (expansion ratio: 7.5) | | | | | 5.0 |
| Bonding cure (1st cure at 100° C.) | XXX | XXX | XXX | XXX | XXX |
| Debonding adhesive cure (2nd cure at 200° C.) | OOO | OOO | OOO | XXX | XXX |
| Performance as a temporary bonding adhesive | Good | Good | Good | Bad | Bad |

INDUSTRIAL APPLICABILITY

The silicone composition of the present disclosure is suitable for manufacturing an electronic article. The electronic article manufactured by the composition is used as a temporary bonding adhesive when surface treatment is treated, which is advantageous in that the adhesive is removed without residues.

Many modifications and other embodiments of the invention will come to mind to one skilled in the art to which this invention pertains, having the benefit of the teachings presented in the foregoing description. Therefore, it is to be understood that the invention is not to be limited to the specific embodiments disclosed and that modifications and other embodiments are intended to be included within the scope of the appended claims.

The invention claimed is:

1. A manufacturing method of an electronic article, the method comprising:
   (a) coating a silicone composition on at least a part of the surface of an intermediate of an electronic article;
   (b) forming a cured body by curing the silicone composition coated on the intermediate;
   (c) surface treating the intermediate on which the cured body is formed; and
   (d) removing the cured body from the intermediate;
   wherein the silicone composition comprises:
   (A) a polydiorganosiloxane having at least two alkenyl groups in each molecule;
   (B) a polyorganosiloxane having at least one silicon-bonded hydrogen atom in each molecule; and
   (C) a thermally expandable powder having an expansion ratio of 10 or more; and
   wherein (d) is conducted at a temperature that expands component (C) thereby facilitating removal of the cured body.

2. The manufacturing method of an electronic article according to claim 1, wherein component (A) is represented by formula (1):

  (1)

wherein in formula (1):
- each R' is an alkenyl group containing from 2 to 10 carbon atoms;
- R" does not contain ethylenic unsaturation, and is identical or different and individually selected from a monovalent saturated hydrocarbon group containing from 1 to 10 carbon atoms, and a monovalent aromatic hydrocarbon group containing from 6 to 12 carbon atoms, and optionally R" is unsubstituted or substituted with the group that does not interfere with curing of the composition;
- R'" is identical to R' or R"; and
- m represents a degree of polymerization that component (A) has a viscosity of at least 0.1 Pa·s at 25° C.

3. The manufacturing method of an electronic article according to claim 1, wherein component (B) is present in an amount such that the molar ratio of the total number of the silicon-bonded hydrogen atoms in component (B) to the total quantity of all alkenyl groups in component (A) is from 0.4:1 to 20:1.

4. The manufacturing method of an electronic article according to claim 1, wherein component (B) is selected from the following compounds:
- (i) trimethylsiloxy-terminated methylhydrogenpolysiloxane;
- (ii) trimethylsiloxy-terminated polydimethylsiloxane-methylhydrogensiloxane copolymer;
- (iii) dimethylhydrogensiloxy-terminated dimethylsiloxane-methylhydrogensiloxane copolymer;
- (iv) dimethylsiloxane-methylhydrogensiloxane cyclic copolymer;
- (v) a copolymer composed of $(CH_3)_2HSiO_{1/2}$ units and $SiO_{4/2}$ units; and
- (vi) a copolymer composed of $(CH_3)_3SiO_{1/2}$ units, $(CH_3)_2HSiO_{1/2}$ units, and $SiO_{4/2}$ units.

5. The manufacturing method of an electronic article according to claim 1, wherein the average particle diameter before expansion of component (C) is from 1 to 60 μm.

6. The manufacturing method of an electronic article according to claim 1, wherein the silicone composition further comprises:
(D) a hydrosilylation reaction catalyst.

7. The manufacturing method of an electronic article according to claim 1, wherein the silicone composition further comprises:
(E) a hydrosilylation reaction inhibitor.

8. The manufacturing method of an electronic article according to claim 1, wherein the intermediate of (a) is an electromagnetic interference (EMI) shield of the electronic article.

9. The manufacturing method of an electronic article according to claim 1, wherein the surface treatment of (c) is an anodizing process.

10. The manufacturing method of an electronic article according to claim 1, wherein curing of (b) is conducted at a temperature of 25° C. to 200° C.

11. The manufacturing method of an electronic article according to claim 1, wherein the surface treatment of (c) is a thermal treatment, an electromagnetic treatment, or an anodizing treatment.

12. The manufacturing method of an electronic article according to claim 1, wherein (d) is conducted at a temperature higher than the curing temperature of (b) within 100° C. to 285° C.

* * * * *